US 6,672,379 B1

United States Patent
Wang et al.

(10) Patent No.: US 6,672,379 B1
(45) Date of Patent: Jan. 6, 2004

(54) POSITIONING AND BUCKLING STRUCTURE FOR USE IN A RADIATOR

(75) Inventors: Jack Wang, No. 2, Ta-Chih Road, Taoyuan City, Taoyuan Hsien (TW); Cheng-Hua Cheng, Taoyuan (TW); Michael Lin, Taoyuan (TW); Charles Ma, Taoyuan (TW)

(73) Assignees: Waffer Technology Corp., Taoyuan Hsien (TW); Jack Wang, Taoyuan Hsien (TW)

( * ) Notice: Subject to any disclaimer, the term of this patent is extended or adjusted under 35 U.S.C. 154(b) by 0 days.

(21) Appl. No.: 10/206,666

(22) Filed: Jul. 29, 2002

(51) Int. Cl.[7] .................................................. F28F 7/00
(52) U.S. Cl. ...................... 165/185; 165/80.3; 361/697; 361/704; 257/722; 174/16.3
(58) Field of Search ................................ 165/80.3, 185; 361/703, 704, 709, 710, 697; 257/706, 722; 174/16.3

(56) References Cited

U.S. PATENT DOCUMENTS

| 2,434,676 | A | * | 1/1948 | Spender | ...................... 165/185 |
| 5,558,155 | A | * | 9/1996 | Ito | .............................. 165/80.3 |
| 6,104,609 | A | * | 8/2000 | Chen | ............................ 361/695 |
| 6,336,498 | B1 | * | 1/2002 | Wei | .............................. 165/80.3 |
| 6,340,056 | B1 | * | 1/2002 | Huang et al. | ................ 165/185 |
| 6,382,307 | B1 | * | 5/2002 | Wang et al. | ................. 165/80.3 |
| 6,386,275 | B1 | * | 5/2002 | Kuo et al. | .................... 165/80.3 |
| 6,401,810 | B1 | * | 6/2002 | Kuo et al. | .................... 165/185 |
| 6,446,709 | B1 | * | 9/2002 | Huang | ......................... 165/80.3 |
| 6,449,160 | B1 | * | 9/2002 | Tsai | ............................ 361/709 |
| 6,474,407 | B1 | * | 11/2002 | Chang et al. | ............... 165/80.3 |

* cited by examiner

Primary Examiner—Terrell McKinnon
(74) Attorney, Agent, or Firm—Browdy and Neimark

(57) ABSTRACT

A radiator with positioning and buckling structure includes multiple metal plates, each of which has a main body, and a folded side portion is connected to one or two sides of the main body. The positioning and buckling structure is disposed on each of the metal plates. The positioning and buckling structure includes a snapping piece extending from the folded side portion. The snapping piece has a cleaved groove thereon and at two sides of the snapping piece there is provided two hooking portions. A buckling slot is disposed on the folded side portion of the metal plate corresponding to the snapping piece. The buckling slot is connected to a rear opening having a smaller width than the width of the snapping piece so that the metal plates can be stacked together.

6 Claims, 7 Drawing Sheets

POSITIONING AND BUCKLING STRUCTURE FOR USE IN A RADIATOR

BACKGROUND OF THE INVENTION

1. Field of the Invention

The present invention relates to a buckling structure for combining multiple radiating fins and in particular, a high-density buckling mechanism for a stack of radiating fins comprising a plurality of metal plates.

2. Description of the Prior Art

As computer technology advances to deep sub-micron age, the dimension of microchips dramatically shrinks and the speed of these chips largely increases. This causes a heat problem when operating such high-density microchips. To dissipate the heat generated by the operating microchips and avoid the chips from burning down, radiating fins having large heat dissipating area are typically combined with the microchips. Generally, according to their fabrication method, there are three types of them: aluminum extrusion type, pressing molding type, and folded stack type. The aluminum extrusion type and pressing molding type radiating fins are superseding folded stack type radiating fins these days since the former provides limited heat dissipating area due to fabrication ability. The later provides higher packing density and thus has higher heat dissipating performance.

FIG. 1 illustrates a typical view of a prior art folded stack type radiating fin structure. The prior art folded stack type radiating fin structure 10a comprises a plurality of metal plates 11a each of which is formed by means of conventional mechanical pressing method and has similar size. The metal plate 11a is made of metal materials with high thermal conductivity such as copper or aluminum. Typically, the metal plate 11a is shaped into a U-shape or approximate L shape. The metal plate 11a comprises a main body 12a connected with an upper folded side and folded side portion 13a arranged in a parallel manner. The metal plates 11a are connected with a heat dissipating substrate 20a by soldering the lower folded side 13a with the surface of the substrate 20a. The substrate 20a is typically made of high thermal conductive metal materials such as copper or aluminum.

As illustrated in FIG. 1, to position the metal plates 11a, there are provided protruding portions 14a and corresponding recess portions 15a on each of the upper and lower folded sides 13a. The metal plates 11a are stacked in position by engaging the protrusion 14a with the corresponding recess portions 15a. However, such prior art positioning mechanism provides poor combination. Sometimes, metal plates 11a fall off due to collision.

FIG. 2 shows another prior art folded stack type radiating fin structure according to Taiwan Patent Publication No. 407753. As shown in FIG. 2, the radiating fins 30a comprises a plurality of metal plates 31a having at least one pair of buckling pieces 32a disposed at two opposite sides of each of the metal plates 31a. Each of the buckling pieces 32a defines a locking opening thereof. With such configuration, the metal plates 31a are stacked in approximately equal spacing for the sake of convection. An extending heat conducting strip 33a is combined at the lower side of each of the metal plates 31a. When assembling, the extending heat conducting strip 33a provides more heat dissipating area. Another approach to the improvement of positioning the radiating fins is disclosed in Taiwan Patent Publication No. 460110, entitled "Radiating Structure for Computer CPU". A plurality of metal plates buckle to each other to form a radiating set. Buckling slots and buckling hooks are provided along an upper side of each of the metal plates. A folded heat conducting wing piece is provided at a lower, side of each of the metal plates. The width of the buckling slot is equal to the width of the heat conducting wind piece. The buckling hook extends from the center of the buckling slot and has a smaller width than the width of the buckling slot, such that the buckling hook can be folded into the slot. When assembling, the heat conducting wing piece of each of the metal plates contacts the underlying substrate.

Unfortunately, the above-mentioned prior art patents cannot provide firmly joint between two metal plates. Accordingly, there is a strong need for an improved buckling structure for radiating fins which is simplified and have good reliability.

SUMMARY OF THE INVENTION

The main objective of the invention is to provide an improved radiator with positioning and buckling structure to solve the above-mentioned problems. In accordance with the present invention, a radiator with positioning and buckling structure is provided. The radiator is comprised of multiple metal plates, each of which comprises a main body, and a folded side portion connected to one or two sides of the main body. The positioning and buckling structure for a radiator is disposed on each of the metal plates. The positioning and buckling structure includes a resilient snapping piece extending from the folded side portion. The resilient snapping piece has a cleaved groove thereon and at two sides of the snapping piece there is provided two hooking portions. A buckling slot is disposed on the folded side portion of the metal plate corresponding to the snapping piece. The buckling slot is connected to a rear opening having a smaller width than the width of the snapping width. The metal plates are stacked together by inserting the snapping piece of the metal plate into the buckling slot of an adjacent metal plate, the protrusion of the aperture passes through the rear opening to engage with the buckling slot. Other objects, advantages and novel features of the invention will become more clearly and readily apparent from the following detailed description when taken in conjunction with the accompanying drawings.

DETAILED DESCRIPTION OF THE PREFERRED EMBODIMENTS

Figure 1:
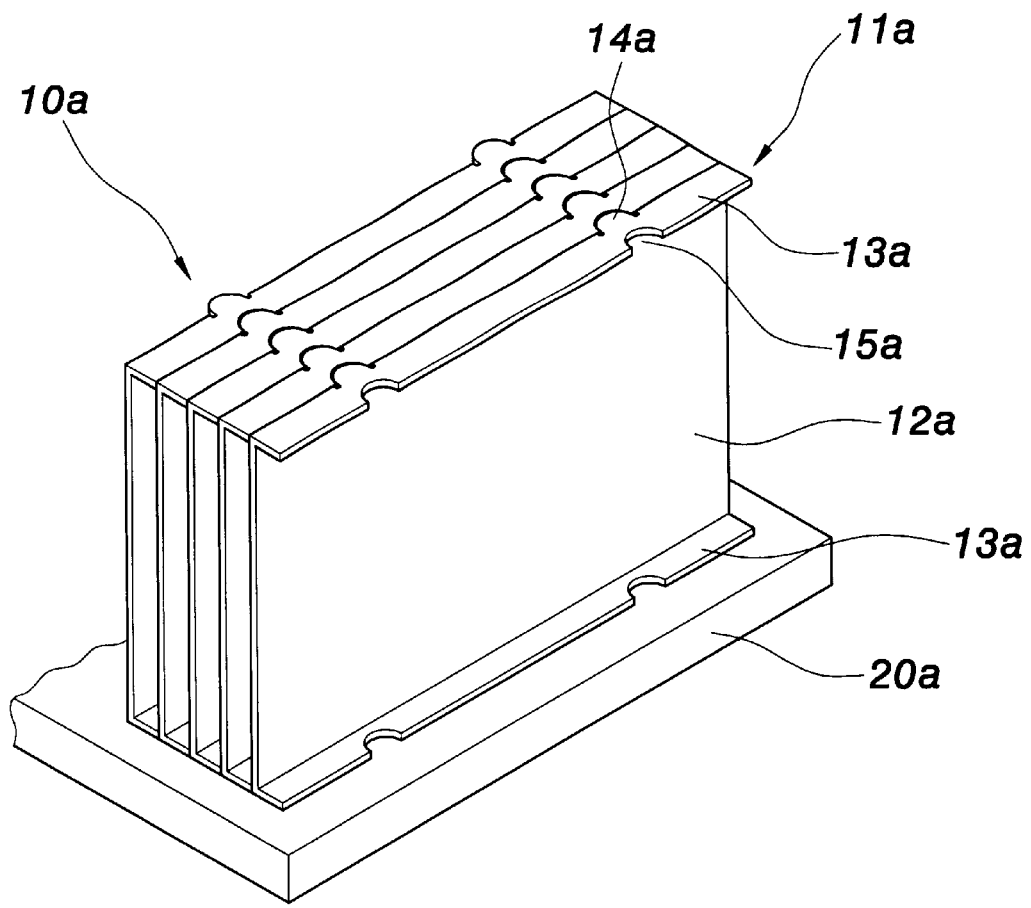
FIG. 1 illustrates a typical view of a prior art radiating fin stack.
Figure 2:
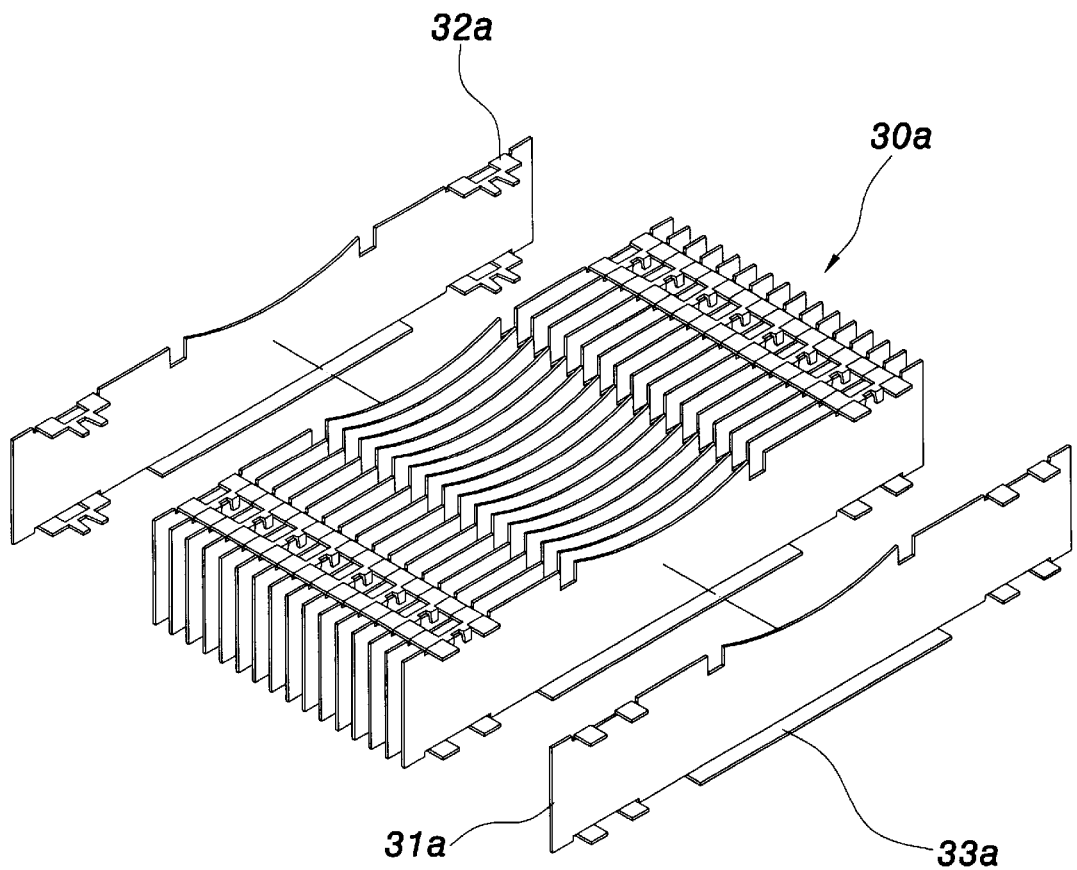
FIG. 2 is a perspective view of another prior art radiating fin stack.
Figure 3:
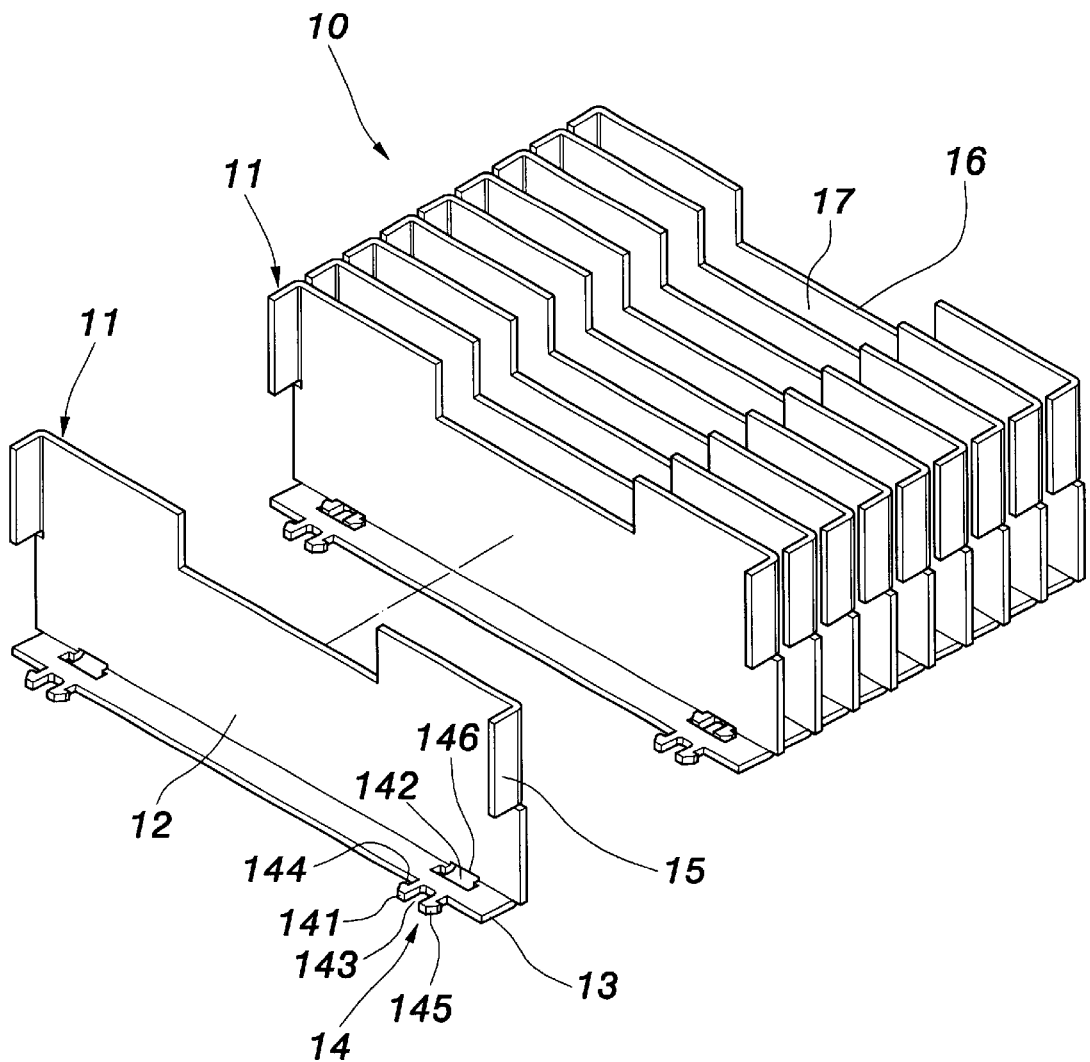
FIG. 3 is a perspective, exploded diagram according to the first preferred embodiment of this invention.
Figure 4:
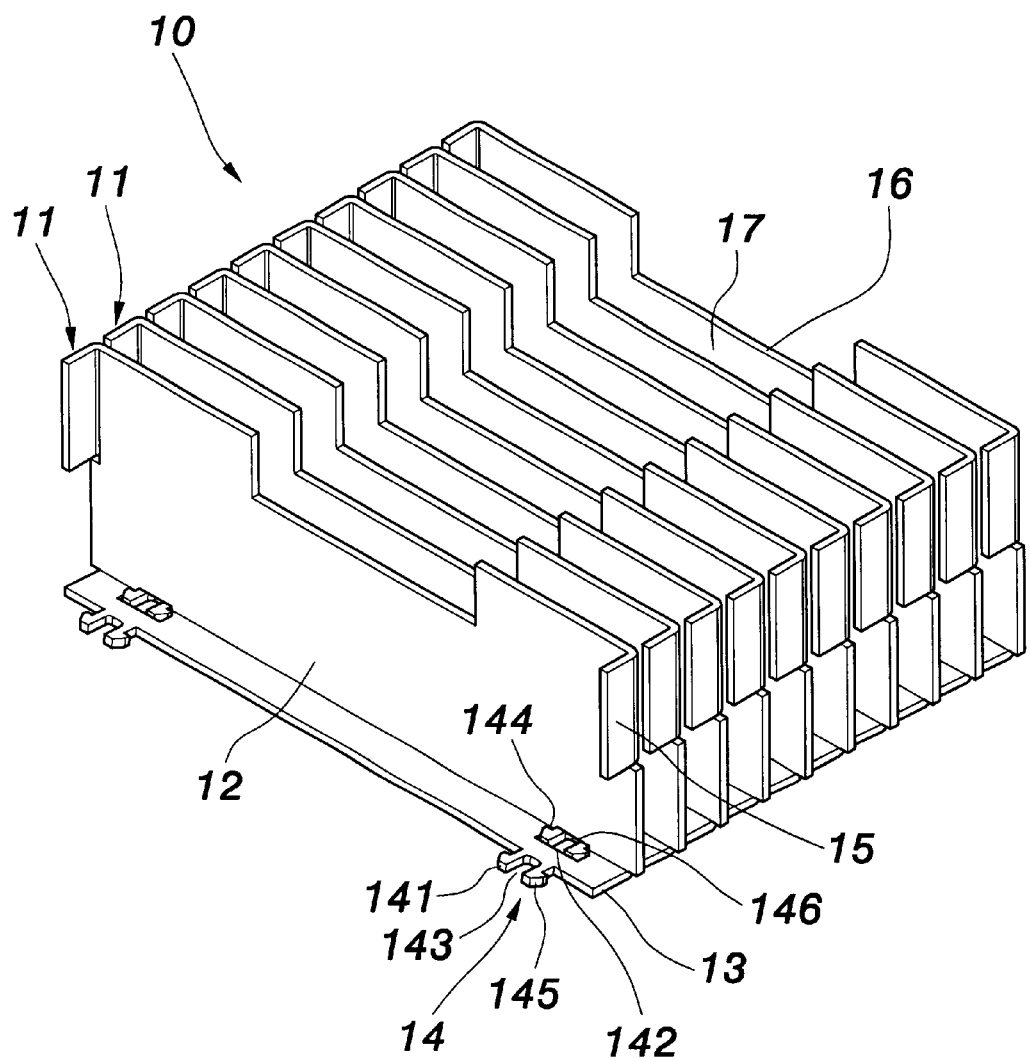
FIG. 4 is a perspective, assembly diagram according to the first preferred embodiment of this invention.

Referring to FIG. 3 and FIG. 4, the present invention is directed to a radiator with positioning and buckling structure, especially suited for electric heat generating devices such as microchips. As illustrated, a radiator 10 is comprised of a plurality of thin metal plates 11, each of which is cut into similar size and shape. Typically, to obtain a desired shape, these metal plates 11 are processed by a mechanical pressing known in the art. The metal plates 11 are made of metals having high thermal conductivity such as copper or aluminum. Preferably, each of the metal plates 11, which are pressed into an approximate L shape, has a main body 12 and a folded side portion 13 connected with the main body 12. The angle between the main body 12 and the folded side portion 13 is about 90 degree.

At the left and right sides respectively, side folded portions 15 are provided. Preferably, the folded lower portion 13 and the side folded portions 15 are integrally formed with the main body 12. A recess 16 is formed at the top of the main body 12. When assembling, the recess 16 of the main body 12 of the metal plate 11 is used to accommodate a heat-radiating fan (not shown). Since the recess 16 is not the major feature of the present invention and is known in the art, detailed discussion on it is therefore omitted.

At least one positioning and buckling structure 14 is provided on each of the metal plates 11. By capitalizing on the positioning and buckling structure 14, the metal plates 11 can tightly connected to each other, so as to form a solid fin-type stack. The number and size of the metal plates 11 is subject to change depending upon the object to be heat dissipated. Likewise, the number and dimension of the positioning and buckling structure 14 can be properly changed depending upon user's needs.

The positioning and buckling structure 14 comprises a resilient snapping piece 141 and a buckling slot 142. The resilient snapping piece 141 extends from the edge of the folded lower portion 13 of the metal plate 11. The snapping piece 141 is integrally formed with the folded side portion 13 and corresponds to the buckling slot 142.

A cleaved opening 143 is formed on the snapping piece 141. The cleaved opening 143 may be a U shaped perforated hole or other shapes. The cleaved opening 143 is connected to a front opening. By capitalizing on the cleaved opening 143, the snapping piece 141 has a hollow inner portion, such that the width of the snapping piece 141 can change.

On each of the two outer sidewalls of the resilient snapping piece 141 there is provided a hooking portion 144. The two hooking portions 144 extend in opposite directions from the outer sidewalls of the snapping piece 141 for a proper height. At the front end of the hooking portions 144, a guiding reverse angel structure 145 is provided for smoothly guiding the snapping piece 141 into the buckling slot 142.

The buckling slot 142 is formed on the folded side portion 13 of the metal plate 11. The buckling slot 142 is arranged corresponding to the snapping piece 141 of an adjacent metal plate. The buckling slot 142 is connected to a rear opening 146 having an increasing width, such that two inclined inner sidewalls are formed at the rear opening 146. The inclined sidewalls facilitate the engagement between the snapping piece 141 and the buckling slot 142. The width of rear opening 146 is smaller than the width of the snapping piece. The buckling slot 142 has a width that is substantially equal to the width of the snapping piece 141.

Referring to FIG. 4, the plurality of metal plates 11 are stacked and firmly combined with each other by means of the positioning and buckling structure 14. The metal plate 11 is tightly combined with another metal plate by inserting the snapping piece 141 of the positioning and buckling structure 14 into the rear opening 146, and engages with the buckling slot 142. The snapping piece 141 passes through the rear opening 146 and slides into the positioning and buckling slot 142. Although the rear opening 146 has a width normally smaller than the width of the snapping piece 141, since the width of the cleaved opening 143 is flexible, when the snapping piece 141 passes through the rear opening 146, the two hooking portions 144 surrounding the cleaved opening 143 are squeezed by the inner walls of the rear opening 146, and decrease the width of the snapping piece 141, such that the snapping piece 141 can enter the buckling slot 142.

Upon the snapping piece 141 enters the buckling slot 142, due to the resilient force of the snapping piece, the width of the snapping piece 141 returns to its original width, which is larger than the width of the rear opening 146, such that the snapping piece 141 is restricted inside the buckling slot 142. After stacking the metal plates 11, air channels 17 are formed between two adjacent metal plates 11.

Figure 5:
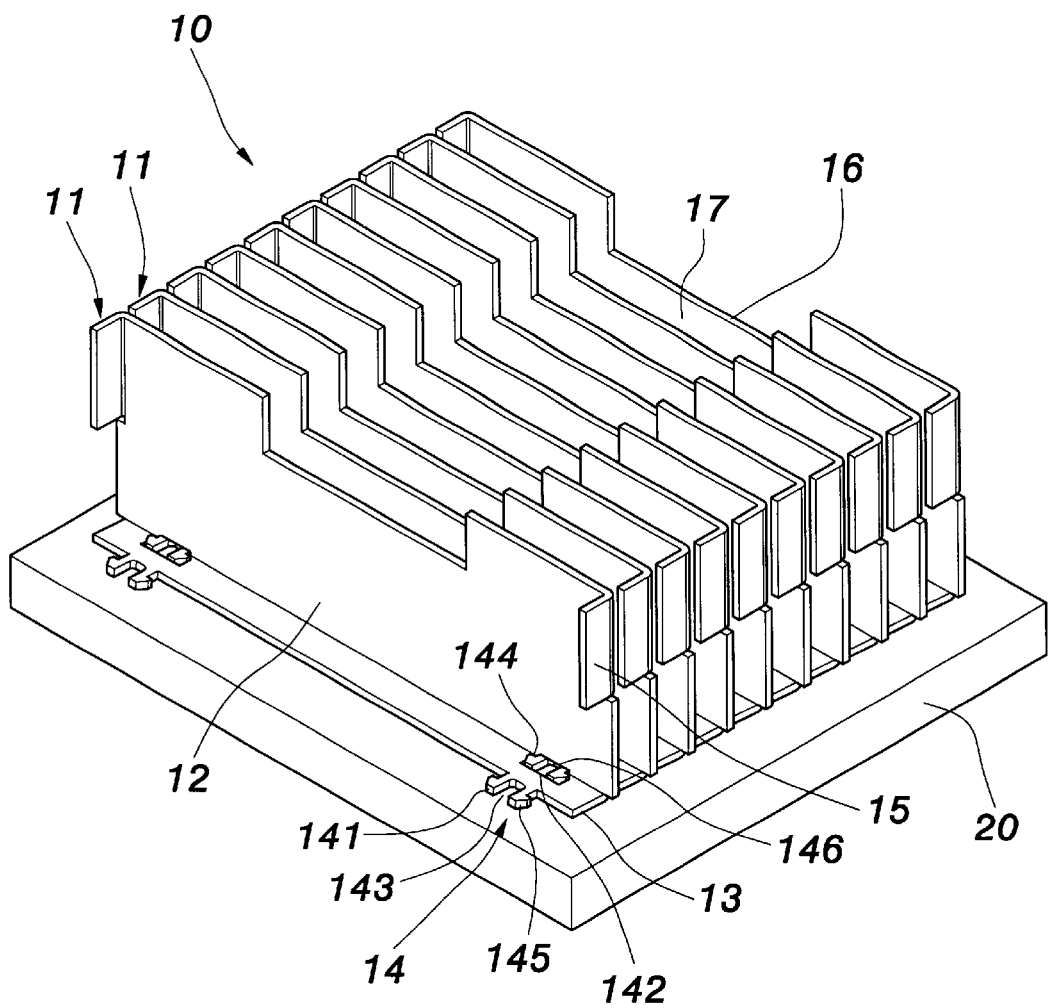
FIG. 5 is a perspective diagram according to the first preferred embodiment of this invention, when combined with a substrate.

Referring to FIG. 5, the heat-radiating device of this invention is further connected with a heat dissipating substrate 20 by gluing or soldering the folded side portion 13 of the main body 12 of the metal plate 11 onto the heat dissipating substrate 20. The substrate 20 is preferably made of metal such as copper or aluminum. The folded side portion 13 of the main body 12 of the metal plate 11 is soldered onto a top surface or other proper site of the heat dissipating substrate 20. The substrate 20 is then attached onto a heat-generating electric object (not shown) to help the heat dissipating.

The present invention features that the radiator 10 has high density heat dissipating area and therefore high heat-dissipating efficiency. The metal plates 11 are stacked by using the positioning and buckling structure 14 to form a solid fin-type stack. The snapping piece 141 of the positioning and buckling structure 14 can firmly connect with the buckling slot 142, such that the snapping piece 141 is tightly combined with the buckling slot 142. Plus, the snapping piece 141 is flexible and can repeatedly engage or disengage with the buckling slot 142. In contrast, the packing of the stack according to this invention is much more denser and solider than the prior art structures.

Figure 6:
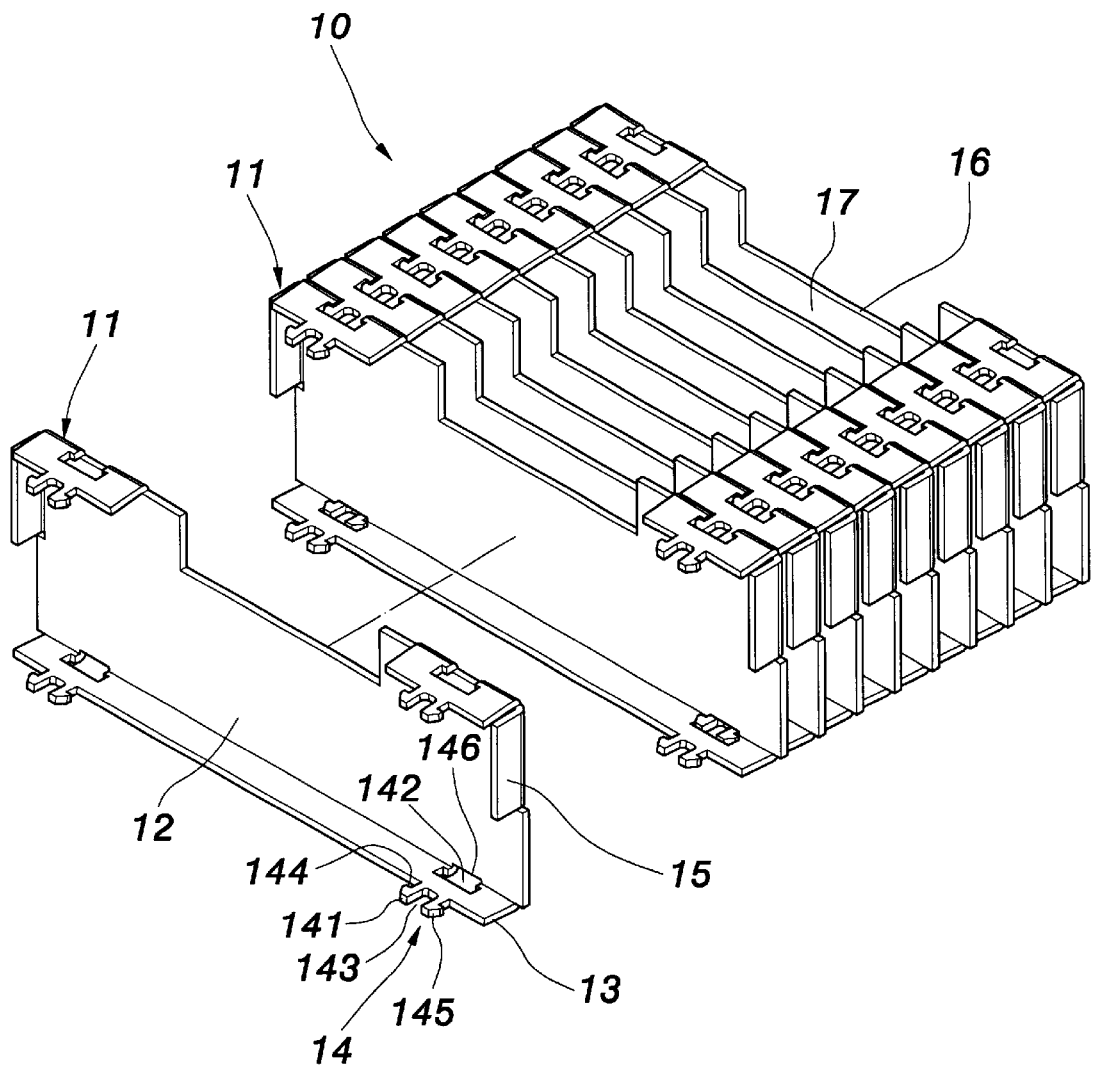
FIG. 6 and FIG. 7 are perspective diagrams according to the second preferred embodiment of this invention.
Figure 7:
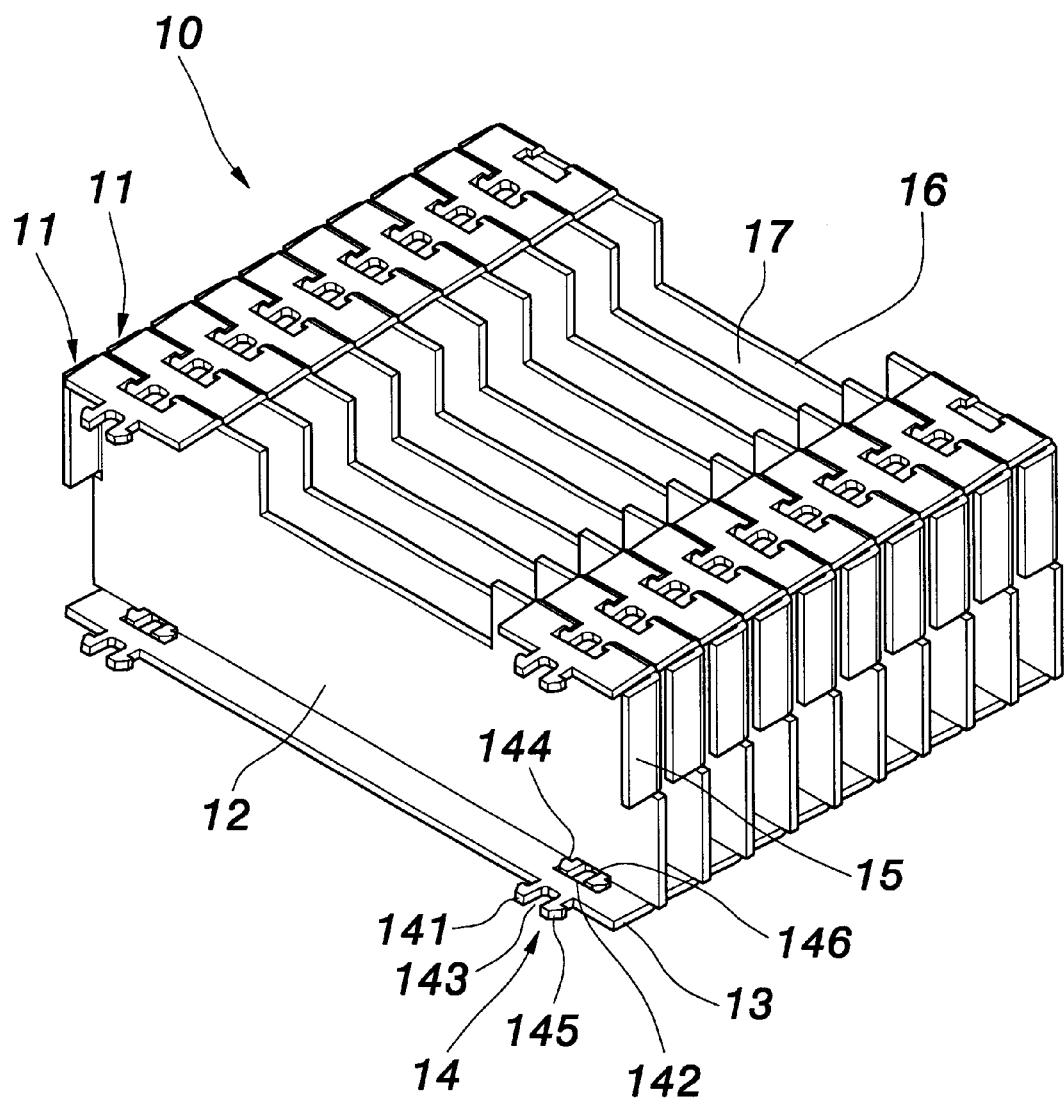

Referring to FIG. 6 and FIG. 7, the metal plates 11 according to this invention can be U-shaped or other shapes. The upper and lower sides of the main body of the metal plate 11 are connected with at least one folded side portion 13. The snapping pieces 141 and the buckling slots 142 are disposed at the upper edge and the lower edge of the main body 12 of the metal plate 11.

To sum up, the present invention provides an improved radiator with positioning and buckling structure. The packing of the stack is much more denser and solider than the prior art structures. The present invention can provide firmly joint between two metal plates.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A positioning and buckling structure adapted for use in a radiator, the radiator including a plurality of metal plates each having a main body and a side folded portion connecting at least one of two opposite sides of the main body, the positioning and buckling structure disposed on each of the metal plates, the positioning and buckling structure comprising:

a snapping piece extending from a front edge of the side folded portion, having a fork-like shape portion with two corresponding sides, a cleaved opening formed between the two corresponding sides, a guiding revised angle structure formed on and outwardly extending from an end of each of the two corresponding sides, and a hooking portion disposed on and extending from the guiding revised angle structure; and a buckling slot formed on a rear edge of the side folded portion and corresponding to the snapping piece, the buckling slot communicating with a rear opening formed at a bottom of each of the metal plates, and having a width thereof smaller than a width of the snapping piece and larger than a width of the rear opening;

wherein the metal plates are stacked together side by side for inserting the snapping piece of each of the metal plates into the buckling slot of an adjacent metal plate, wherein the snapping piece engages the buckling slot by penetrating through the rear opening and clamping two sides of the buckling slot by the hooking portion.

2. The positioning and buckling structure as claimed in claim 1 wherein the folded side portion is connected with the lower side of the main body.

3. The positioning and buckling structure as claimed in claim 1 wherein the folded side portion is connected to a lower side and a upper side of the main body.

4. The positioning and buckling structure as claimed in claim 1 wherein guiding reverse angle structures are provided at the two corners of the front hooking portions.

5. The positioning and buckling structure as claimed in claim 1 wherein the rear opening has an increasing width to form inclined sidewalls at the rear opening.

6. The positioning and buckling structure as claimed in claim 1 further comprising a heat dissipating substrate being connected with the folded side portions of the metal plates.

* * * * *